United States Patent
Haumesser et al.

(10) Patent No.: US 6,510,169 B2
(45) Date of Patent: Jan. 21, 2003

(54) METHOD FOR GENERATING LASER LIGHT AND LASER CRYSTAL

(75) Inventors: Paul Henri Haumesser, Saint Martin d'Heres (FR); Romain Gaume, Paris (FR); Bruno Viana, Montgeron (FR); Gerard Aka, Vitry sur Seine (FR); Daniel Vivien, Garches (FR)

(73) Assignee: Forschungsinstitut fur Mineralische und Metallische Werkstoffe Edelsteine/Edemetalle GmbH (DE)

( * ) Notice: Subject to any disclaimer, the term of this patent is extended or adjusted under 35 U.S.C. 154(b) by 143 days.

(21) Appl. No.: 09/782,787

(22) Filed: Feb. 14, 2001

(65) Prior Publication Data

US 2002/0110168 A1 Aug. 15, 2002

(51) Int. Cl.$^7$ ................................................ H01S 3/16
(52) U.S. Cl. .................... 372/41; 372/69; 359/341.5; 359/345
(58) Field of Search ............................. 372/39, 69, 41, 372/75, 43, 89; 359/345, 341.3, 341.5; 117/22

(56) References Cited

U.S. PATENT DOCUMENTS

| | | | | |
|---|---|---|---|---|
| 3,624,547 A | * | 11/1971 | Dugger | 372/89 |
| 3,659,221 A | * | 4/1972 | Melamed et al. | 372/41 |
| 3,710,278 A | * | 1/1973 | Hopkins et al. | 372/41 |
| 5,970,079 A | * | 10/1999 | Zavartsev et al. | 372/41 |
| 6,301,275 B2 | * | 10/2001 | Eichenholz et al. | 372/42 |

FOREIGN PATENT DOCUMENTS

| | | | | |
|---|---|---|---|---|
| JP | | 401081380 A | * 3/1989 | 372/41 |

OTHER PUBLICATIONS

P.H. Haumesser, R. Gaumé, B. Viana, A. Kahn Harari, G. Aka, and D. Vivien, "Elaboration and Spectroscopic Analysis of New Yb3+ Doped Double Borates," OS Topical Conference on Advanced Solid State Lasers, Davos, Switzerland Feb. 14–16, 2000.

S. Erhard, J. Gao, A. Giesen, K. Contag, A.A. Lagatsky, A. Abolvand, N.V. Kuleshov,J. Aus der Au, G.J. Spühler, F. Brunner, R. Paschotta and U. Keller "High Power Yb: KGW and Yb: KYW thin laser operation," CLEO 2001, Abstract CWF2, p 333 (OSA Technical Digest, 2001).

A. Giesen, "Thin Is Cool For High–Power Lasers," Phononics Spectra, Dec. 1997, p. 94.

L.D. DeLoach, S.A. Payne, L.L. Shase, L.K. Smith, W.L. Kway and W.F. Krupke, "Laser and Spectroscopic Properties of Sr5(PO4)3F:Yb," J. Opt. Soc. Am. B, vol. 11, No. 2, Feb. 1994, p. 269.

L.D. DeLoach, S.A. Payne, L.L. Chase, L.K. Smith, W.L. Kway and W. F. Krupke, "Evaluation of Absorption and Emission Properties of Yb3+ Doped Crystals For Laser Applications," IEEE J. Quantum El. 29 (1993) 1179–1191.

* cited by examiner

Primary Examiner—Albert W. Paladini
(74) Attorney, Agent, or Firm—Paul & Paul

(57) ABSTRACT

A crystalline material for optically pumped solid state lasers has the chemical composition of $M_3RE_{1-x}Yb_x(BO_3)_3$, where M is selected from the group Mg, Ca, Sr, Ba, and Ra, optionally replaced at least partially with another element from this group, RE is selected from the group Sc, Y, Lu, and Y partially replaced with Lu, and x is greater than or equal to 0 and less than or equal to 1. The material is useful for preparing lasers having high average initial power and short pulse duration, and has flat amplification and fluorescence spectra, high thermal conductivity and a large emission cross-section.

10 Claims, No Drawings

METHOD FOR GENERATING LASER LIGHT AND LASER CRYSTAL

The present invention relates to a method for generating laser light, a laser crystal, and a laser Which uses said laser crystal.

A laser is an amplifier and generator of electromagnetic waves. The amplification of light thus relates to the procedure of induced emission. In general, a suitable material that has appropriately arranged energy levels is arranged within a resonator and optically pumped such that a population inversion of the energy levels occurs.

A whole range of different materials is employed as the active material, or respectively laser material. Semiconductor lasers are known, for example. Different types of conductivity are generated by doping the semi-conductor crystal with impurity atoms. If a p-n junction is charged in the direction of flow, electrons and holes are driven towards one another by means of the voltage applied, and can recombine to radiate, emitting a light quantum. In order to obtain laser operation, that is to say population inversion, there has to be sufficiently strong doping of one side of the p-n junction for the associated Fermi level to lie in one band. Gallium arsenide is used in this instance, for example.

A further class of laser materials is represented by the so-called dye lasers. In this case, dye molecules with a very high molecular weight, for example, rhodamine, sodium fluorescein and others are used as the active medium, which are dissolved in water, alcohol or other solvents. Because of the numerous vibrational states of the molecules, the emission spectrum displays a wide band, so the dye laser can be tuned across a large wavelength range. This is done, for example, by replacing a cavity mirror with a diffraction grating.

A third class of lasers is represented by so-called gas lasers. In this case, the excitation is done by impact in a gas discharge. A mixture of different gases is often used, as excitation energy is stored in the non laser active gas, and can be transferred by impacts of a second type to the active gas. Examples of gas lasers are helium-neon lasers, noble gas lasers, and $CO_2$ lasers.

A further class of lasers is represented by optically pumped solid state lasers. In order to obtain a population inversion between two lasers here, the solid state is optically pumped, that is to say more atoms are intentionally excited by supplying energy than would correspond to the thermal balance. For example, the "active medium" in which inversion is possible can be illuminated using an intensive flash light.

With most laser materials, difficulties arise in that during the pumping procedure not all atoms end up in the same excited state, and the pumping energy used is distributed over several states. Thus, despite a high degree of energy expenditure, only a few atoms are available for amplification of a specific frequency.

In recent years, interest has centred on laser materials doped with ytterbium, as it is hoped that with the aid of these materials, efficient diode-pumped lasers can be manufactured. Because of its electronic structure, the ytterbium ion has, on the one hand, the advantage of a broad absorption and fluorescence band, and on the other hand shows only low thermal stress. This is because, inter alia, ytterbium does not have a high energy level. Ytterbium can be easily doped with relatively high concentrations. Moreover, the absorption band in ytterbium doped crystals can be covered by standard, generally available diode lasers which emit in the wavelength range between 930 and 990 nanometers.

Compared to other rare-earth doping such as, for example, neodymium, ytterbium doped materials show broader emission bands such as are necessary for so-called ultra-fast lasers which emit short pulses. When generating short and ultra-short laser pulses, there are two opposing classes of ytterbium doped materials in the prior art. On the one hand, ytterbium doped glasses are used, with which pulse widths of less than 100 femtoseconds are generated. On the other hand, ytterbium ions are doped in a crystalline matrix. For example, for Yb:YAG, a pulse length of 340 femtoseconds is obtained. The shortest pulse length in a crystalline matrix was obtained in Yb:GdCOB material, with 90 femtoseconds. The reason for this considerable difference in the smallest obtainable pulse duration is in the greater smoothness and greater breadth of the amplification spectrum of the glass compared to the crystals. Compared to the crystals, however, Ytterbium doped glasses display a lower thermal conductivity and a smaller emission cross-section. For example, in the case of ytterbium doped phosphate glasses, the emission cross-section is approximately $0.05 \times 10^{-20}$ cm$^2$ with a wavelength of 1060 nm, with a band width of 62 nm, compared to an emission cross-section of $2 \times 10^{-20}$ cm$^2$ with a band width of 12 nm for Yb:YAG, and of $0.5 \times 10^{-20}$ cm$^2$ with a band width of 44 nm for Yb:GdCOB. With the glasses, the large band width results in not insignificant thermal stress problems during operations with a high average power. In addition, the small-signal amplification and laser efficiency are clearly reduced. For example, with the Yb:YAG and YB:GdCOB crystals, a cut-off efficiency of more than 75% is obtainable, whereas the Yb phosphate glasses display a cut-off efficiency of less than 50%.

There is therefore a need for a laser material which, on the one hand, has an amplification spectrum and a fluorescence spectrum which is as flat as possible, and on the other hand, has high thermal conductivity and a large emission cross-section. Such a material is particularly desirable precisely with regard to a high average initial power and a short pulse duration.

The object of the present invention is therefore to provide such a material and respectively a laser with such material.

This object is solved in accordance with the invention with a crystal with the chemical composition $M_3RE_{1-x}Yb_x(BO_3)_3$, wherein M is an element from the group Mg, Ca, Sr, Ba, Ra, wherein M is optionally partially replaced with at least one further element of this group, and RE is either Y or Lu or Y partially substituted by Lu or Sc.

These crystals belong to a large structural family which is formed by replacement of a large number of atoms at the A and M or M' positions in the general formula $A_6MM'(BO_3)_6$. According to the invention, such a structure is used as the base crystal for doping with $Yb^{3+}$ ions.

A particularly preferred embodiment provides that the crystal is a single crystal.

Advantageously, M is either Sr or Ba, or Sr partially substituted by Ba. With the partial substitution of strontium with barium, care must be taken that during crystallisation in the molten bath, no parasitic phases develop. The barium content in the strontium is therefore limited to a value in which $M_3RE_{1-x}Yb_x(BO_3)_3$ phase shows a congruent molten mass.

The value x can be between 0 and 1, regardless of the effect to be achieved. In a preferred embodiment, x is between 0 and 0.6, preferably between 0.1 and 0.4, particularly preferably approximately 0.2.

The laser crystals according to the invention belong to two different crystal structures according to the alkaline earth metals used. For example, the crystal with the chemical formula $Sr_3Y_{1-x}{}_xYb_x(BO_3)_3$ with $0 \leq x \leq 1$ belongs to the space group R-3, while $Ba_3Lu_{1-x}Yb_x(BO_3)_3$ with $0 \leq x \leq 1Y$ belongs to the space group $P6_3$crn. All the bonds form single axis crystals and melt congruently. They are preferably grown from molten mixtures of stoichiometric compositions according to the Czochralski method. Naturally, a non-stoichiometric solution can also be used when, for example, a seed crystal is used. $Y^{3+}$ or $Lu^{3+}$ can be replaced with $Yb^{3+}$ with high doping concentrations without having to take into account any substantial deterioration in quality in the grown crystal.

The molten mixtures are produced by mixing the starter materials. These are alkaline earth metal carbonate or alternatively alkaline earth metal oxide ($MCO_3$ or MO), rare earth oxides ($RE_2O_3$) and boric acid or alternatively boroxide ($H_3BO_3$ or $B_3O_3$). The individual components are mixed homogeneously in powdered form, and react preferably in the solid state to air in a platinum crucible.

In order to maximise the size and quality of the crystals, it is advantageous to keep the temperature of the molten mixture above the growth temperature for a sufficient length of time to ensure complete homogenisation of the liquid. The molten mixture is then cooled to the crystallisation temperature, and a seed crystal is brought into contact with the liquid. After growth, the crystal is pulled out of the liquid and cooled at room temperature. The grown crystals are not hygroscopic and have good mechanical stability and a high degree of chemical resistance. The crystals can easily be sawn, cut and polished. Surfaces with optical laser quality can therefore be obtained using standard polishing techniques.

For better comprehension, the invention will hereinafter be explained with reference to an $Sr_3Y_{0.85}Yb_{0.15}(BO_3)_3$ crystal. Clearly, the following embodiments can be applied in a similar manner to the other crystal compositions claimed.

In order to determine the energy level diagram of the second positions of the $Yb^{3+}$ ions, the absorption spectrum and fluorescence spectrum is recorded at a temperature of 20K. $Yb^{3+}$ shows a strong crystal field interaction and the overall splitting of the $^2F_{7/2}$ level is between 740 and 860 $cm^{-1}$ compared to 628 $cm^{-1}$ with Yb:YAG and 1003 $cm^{-1}$ with Yb:GdCOB. This leads to a very small thermal population of the final state of the laser, so re-absorption losses are reduced.

In the case of the crystal described, the wave length of the absorption peak is 975±2 nm. The absorption band width is 6 nm FWHM. The cross-section of the absorption peak is $0.9 \times 10^{20}$ $cm^2$. The fluorescence of the emission peak in this instance is $0.3 \times 10^{20}$ at 1025 nm and an emission and width of >60 nm. With a laser of this type, a power density of 18 $KW/cm^2$ at 975 Nm can be obtained.

One of the most important advantages of $Yb:Sr_3(BO_3)_3$ is the large absorption band width at a wavelength of around 975 nm. It is therefore possible to pump this laser crystal in the zero-photon-line with high energy laser diodes with a relatively broad emission spectrum. By means of the pumping, at this wavelength the power loss is reduced to a minimal value less than 5% when the laser oscillation is observed in the proximity of 1020 nanometers. Further advantages, features and possibilities for application of the present invention will be evident from the following three examples.

EXAMPLE 1

Diode Pumped Laser

A $Yb:Sr_3Y(BO_3)_3$ crystal was inserted in a plano-concave convoluted resonator. With optical pumping of the crystal by means of a fibre coupled diode arrangement which emits 9 W at 975 nm with a spectral line width around approximately 3 nm (full width at half maximum), an output of 880 mW at 1061 nanometers was measured at an absorbed pumping power of 2.75 W under laser conditions with an output coupler of 2%. The differential efficiency was 55% and the threshold value was 750 mW. The length of the crystal was 1.4 mm and allowed only 34% of the incoming power to be absorbed. Further amplification should therefore be easy to achieve.

EXAMPLE 2

Thin Disc Laser

Another embodiment of a diode pumped laser based on $Yb:Sr_3Y(BO_3)_3$ crystals, enables a construction with a very thin disc wherein a crystal of a reduced length (and therefore correspondingly adjusted absorption) is used, the heat sink of which is the rear mirror of the resonator.

The front side of the thin disc is rebated and its rear side is coated highly reflectively for both the pump wavelength and the laser wavelength. As the crystal is attached to a heat sink, the mirror is kept at a low temperature and the optical distortion is minimised. Furthermore, thermal lens effects and thermally-induced refraction are reduced. The concept of the invention allows a laser beam to be generated with high beam quality and high initial power, both in pulsed lasers and in continuous wave lasers.

EXAMPLE 3

Laser Components Composed of a Plurality of Segments

Bonded or segmented laser components with undoped ends can be critical for high powered lasers. A composite laser element which is composed of a doped $Yb:Sr_3Y(BO_3)_3$ segment and an undoped $Sr_3Y(BO_3)_3$ section reduces the ground state absorption and thermal lens effects. Moreover, the coatings on the undoped ends remain at a low temperature and are therefore not subjected to any interfering thermally induced stresses. Only a negligible scattering loss is induced by means of the interface between the doped and undoped sections. Furthermore, there is a residual reflection corresponding to the small variation in the refractive index between the undoped and the doped material. Composite crystals are capable of increasing the efficiency of diode pumped lasers in general, and in particular of thin disc lasers.

What is claimed is:

1. Crystal with the chemical composition $M_3RE_{1-x}Yb_x(BO_3)_3$, wherein M is an element from the group Mg, Ca, Sr, Ba, Ra, and optionally is partially replaced by at least one further element from this group, RE is either Sc or Y or Lu or Y partially substituted by Lu, and x is a number greater than or equal to 0 and less than or equal to 1.

2. Crystal according to claim 1, characterised in that it is a single crystal.

3. Crystal according to claim 1 or 2, characterised in that M is either Sr or Ba or Sr partially substituted by Ba.

4. Crystal according to one of claims 1 to 2, characterised in that x is between 0 and 0.6, preferably between 0.1 and 0.4, particularly preferably approximately 0.2.

5. Laser with a laser resonator and a laser material, characterised in that a crystal according to a one of claims 1 to 2 is provided as the laser material.

6. Laser according to claim 5, characterised in that a diode, preferably a laser diode, is provided for the optical pumping.

7. Method for generating laser light, in which a laser material is optically pumped, characterised in that a crystal according to one of claims 1 to 2 is used as laser material.

8. Method according to claim 7, characterised in that a diode, preferably a laser diode, is used for optical pumping.

9. Method according to claim 8, characterised in that a diode emitting in the wavelength range between 920 and 980 nanometers is used as the diode.

10. Method according to claim 7, characterised in that the crystal is used for emission of light in the wavelength range between 980 and 1100 nanometers.

* * * * *

UNITED STATES PATENT AND TRADEMARK OFFICE
CERTIFICATE OF CORRECTION

PATENT NO. : 6,510,169 B2
DATED : January 21, 2003
INVENTOR(S) : Paul Henri Haumesser et al.

It is certified that error appears in the above-identified patent and that said Letters Patent is hereby corrected as shown below:

<u>Title page,</u>
Item [73], Assignee, should read -- FEE Forschungsinstitut fur Mineralische und Metallische Werkstoffe Edelsteine/Edelmetalle GmbH --;

<u>Column 1,</u>
Line 5, replace "Which" with -- which --;

<u>Column 3,</u>
Line 13, replace "$Sr_3Y_{1-x\,x}Yb_x(BO_3)_3$" with -- $Sr_3Y_{1-x}Yb_x(BO_3)_3$ --;
Line 14, delete the "Y" at the end of the line;
Line 67, replace "Nm" with -- nm --;

<u>Column 6,</u>
Line 2, replace "to a one" with -- to one --.

Signed and Sealed this

Twenty-second Day of July, 2003

JAMES E. ROGAN
*Director of the United States Patent and Trademark Office*